United States Patent [19]
Suzuki et al.

[11] Patent Number: 5,841,783
[45] Date of Patent: Nov. 24, 1998

[54] FAIL ADDRESS ANALYSIS AND REPAIR SYSTEM FOR SEMICONDUCTOR TEST

[75] Inventors: Toshikazu Suzuki; Yasuhiro Kawata, both of Tokyo, Japan

[73] Assignee: Advantest Corporation, Tokyo, Japan

[21] Appl. No.: 754,922

[22] Filed: Nov. 22, 1996

[30] Foreign Application Priority Data

Nov. 29, 1995 [JP] Japan ................................ 7-310380

[51] Int. Cl.$^6$ ...................................................... G06F 11/00

[52] U.S. Cl. .......................................... 371/5.1; 371/21.1

[58] Field of Search .................................... 371/5.1, 10.3, 371/5.4, 21.1; 395/182.05; 365/200, 201

[56] References Cited

U.S. PATENT DOCUMENTS

| | | | |
|---|---|---|---|
| 4,460,999 | 7/1984 | Schmidt | 371/21.1 |
| 5,107,464 | 4/1992 | Sahara et al. | 365/200 |
| 5,410,687 | 4/1995 | Fujisaki et al. | 370/10.3 |

*Primary Examiner*—Hoa T. Nguyen
*Attorney, Agent, or Firm*—Knobbe, Martens, Olson, & Bear, LLP

[57] ABSTRACT

It is an object of the present invention to provide a repair address analysis system for a semiconductor test which can effect repair of a memory device from fails in a short time even when a fail is produced on a repair line. Fail count means effects counting of fail bits for an address value of a memory device and counting of fail bits of an address value of a repair line simultaneously with each other, and information of the repair line is replaced into the counted address.

1 Claim, 4 Drawing Sheets

FAIL ADDRESS ANALYSIS AND REPAIR SYSTEM FOR SEMICONDUCTOR TEST

BACKGROUND OF THE INVENTION

1. Field of the Invention:

This invention relates to a repair address analysis system from a fail in a memory device of an object of measurement in a semiconductor testing equipment.

2. Description of the Related Art:

Conventionally, in a repair address analysis system for a semiconductor test, when a fail is produced in a memory device of an object of measurement having a redundancy repairing function in a semiconductor testing equipment, the address (hereinafter referred to as repair address) at which the fail has been produced is analyzed by a repair address analysis apparatus connected to the semiconductor testing equipment, and then information at the repair address of the memory device is replaced with information stored on a repair line to repair the memory device from the fail.

Further, if a fail is produced on a repair line, replacement of the repair line is performed by a plurality of times to effect processing against the fail.

FIG. 1 is a block diagram showing an example of a construction of a repair address analysis system for a semiconductor test.

The present conventional example comprises, as shown in FIG. 1, semiconductor testing equipment 150, repair address analysis apparatus 160 for analyzing a repair address of semiconductor testing equipment 150, and testing equipment control unit 170 serving as an interface between semiconductor testing equipment 150 and repair address analysis apparatus 160. Semiconductor testing equipment 150 includes fail memory 151 for storing fail bit count information of a memory device and control unit 152 for controlling fail memory 151. Meanwhile, repair address analysis apparatus 160 includes fail buffer memory 161 for storing, when information stored in fail memory 151 is transferred to repair address analysis apparatus 160, the transferred information, fail count unit 162 for analyzing a repair address based on the information stored in fail buffer memory 161, and control unit 163 for controlling fail buffer memory 161 and fail count unit 162.

In the repair address analysis system for a semiconductor test having such a construction as described above, if a fail is produced in a measurement object memory device in semiconductor testing equipment 150, then fail information is first stored into fail memory 151 by control unit 152.

Then, immediately before a next test is performed by semiconductor testing equipment 150, the information stored in fail memory 151 is transferred to and stored into fail buffer memory 161 of repair address analysis apparatus 160.

Thereafter, fail bit numbers of X address lines and Y address lines of each repair block of the memory device are counted based on the information stored in fail buffer memory 161 by fail count unit 162, and resulting values of the counting are stored into fail count unit 162.

It is to be noted that, in repair of a memory device from fails, repair lines allocated for repair are re-connected for each repair block, and therefore, a situation of fails for each repair block must be discriminated.

FIGS. 2(a) and 2(b) are diagrammatic views illustrating an example of fail count information processed for each repair block, and more particularly, FIG. 2(a) illustrates a divided condition of a memory device and FIG. 2(b) illustrates counting of a fail count unit. It is to be noted that, in FIGS. 2(a) and 2(b), the memory device is divided in four repair blocks.

As shown in FIGS. 2(a) and 2(b), vertical direction fail counts 110-1 to 110-4 and horizontal direction fail counts 120-1 to 120-4 are provided for the four divided repair blocks, and repair addresses of X address lines are stored in vertical direction fail counts 110-1 to 110-4 while repair addresses of Y address lines are stored i n horizontal direction fail counts 120-1 to 120-4. Thus, an analysis of repair addresses is effected based on the thus stored repair address information.

Next, repair of fails of analyzed repair addresses is described.

FIG. 3 is a diagrammatic view illustrating repair of a fail at a repair address of a memory device. It is to be noted that, in FIG. 3, a fail is produced also on a repair line to be replaced with a repair address.

If a fail is produced at each of a2 and b2 points in a memory device, then address y2 is analyzed as a repair address by repair address analysis apparatus 160 (refer to FIG. 1).

Consequently, information of repair line A2 is replaced into address y2.

However, since also repair line A2 ha s a fail produced at point c2, address x2 is analyzed as a repair address by repair address analysis apparatus 160 (refer to FIG. 1).

Consequently, information of repair line C2 is replaced into a address x2.

Here, repair lines A2, B2, C2 and D2 have information, which individually corresponds to addresses in the memory device, stored therein.

It is to be noted that, while the number of repair lines in the present conventional example is four, it is not limited to the specific number, and a number of repair lines required for a memory device are provided.

As described above, a memory device is repaired from fails.

However, in such a conventional system as described above, when a fail is produced on a repair line, in order to repair a memory device from fails, replacement of information of a repair line for a repair address must be performed by a plurality of times. Therefore, the conventional system has a problem in that much time is required to repair a memory device from fails.

SUMMARY OF THE INVENTION

The present invention has been made in view of such a problem of the prior art as described above, and it is an object of the present invention to provide a repair address analysis system for a semiconductor test which can effect repair of a memory device from fails in a short time even when a fail is produced on a repair line.

In order to attain the object described above, according to the present invention, there is provided a repair address analysis system for a semiconductor test which includes a memory device having a redundancy repairing function, a repair line on which information corresponding to a plurality of addresses in the memory device is stored and, when a fail is produced in the memory device, the information corresponding to the address at which the fail is produced in the memory device is replaced, fail count means for counting fail bits for an address value of the memory device, and a fail count memory into which the fail bit count information counted by the fail count means is stored, and wherein the fail count means calculates replacement information of a fail address based on the fail bit count information stored in the fail count memory, characterized in that the fail count means counts fail bits of the repair line simultaneously with counting of fail bits corresponding to a plurality of addresses in the memory device.

In the repair address analysis system for a semi-conductor test of the present invention having the construction described above, since information of fails of the memory device and the repair line is counted by the fail count means, even if a fail is produced on the repair line, an analysis for fails of the repair line can be performed simultaneously with repair address analysis processing for the e memory device. Consequently, no excessive time is required to repair a memory device from a fail.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIGS. 2(a) and 2(b) are diagrammatic views illustrating an example of fail count information processed for each repair block and wherein FIG. 2(a) illustrates a divided state of a memory device and FIG. 2(b) illustrates counting of fail count units;

DETAILED DESCRIPTION OF THE PREFERRED EMBODIMENT

An embodiment of the present invention is described below with reference to the drawings.

Figure 4:
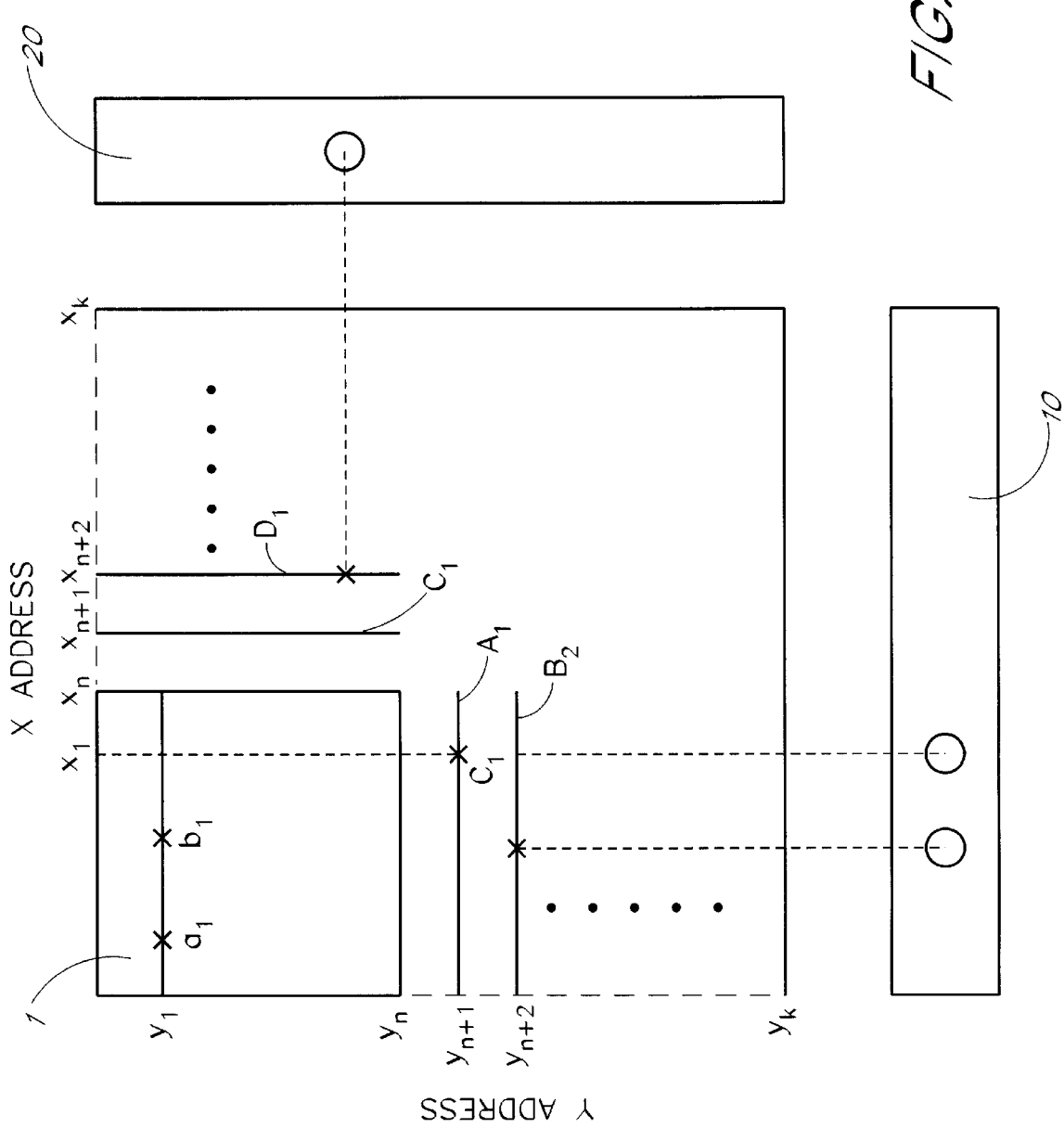
FIG. 4 is a diagrammatic view showing an embodiment of a repair address analysis system for a semiconductor test of the present invention.

FIG. 4 is a diagrammatic view showing an embodiment of a repair address analysis system for a semiconductor test of the present invention.

The present embodiment is similar in construction to the repair address analysis system for a semiconductor test described in the prior art above except only in that, as shown in FIG. 4, also an address at which a fail has been produced on a repair line is analyzed by fail count means and stored in fail count memories 10 and 20.

In the following, processing operation in the present embodiment is described.

Figure 1:
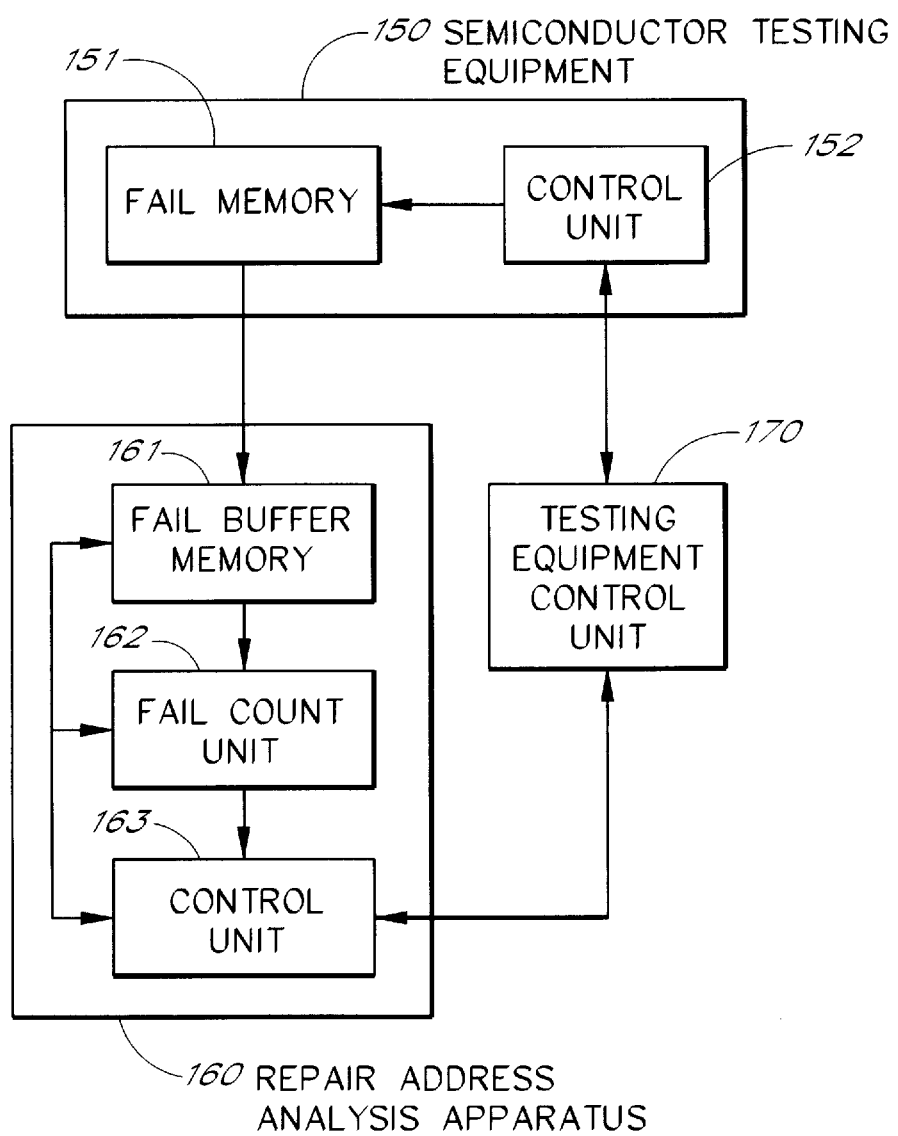
FIG. 1 is a block diagram showing an example of a construction of a repair address analysis system for a semi-conductor test.
Figure 2A:
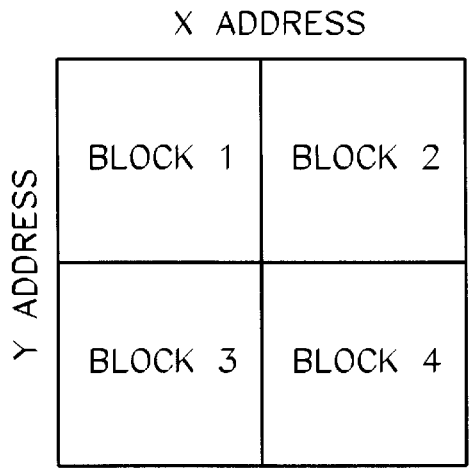
Figure 2B:
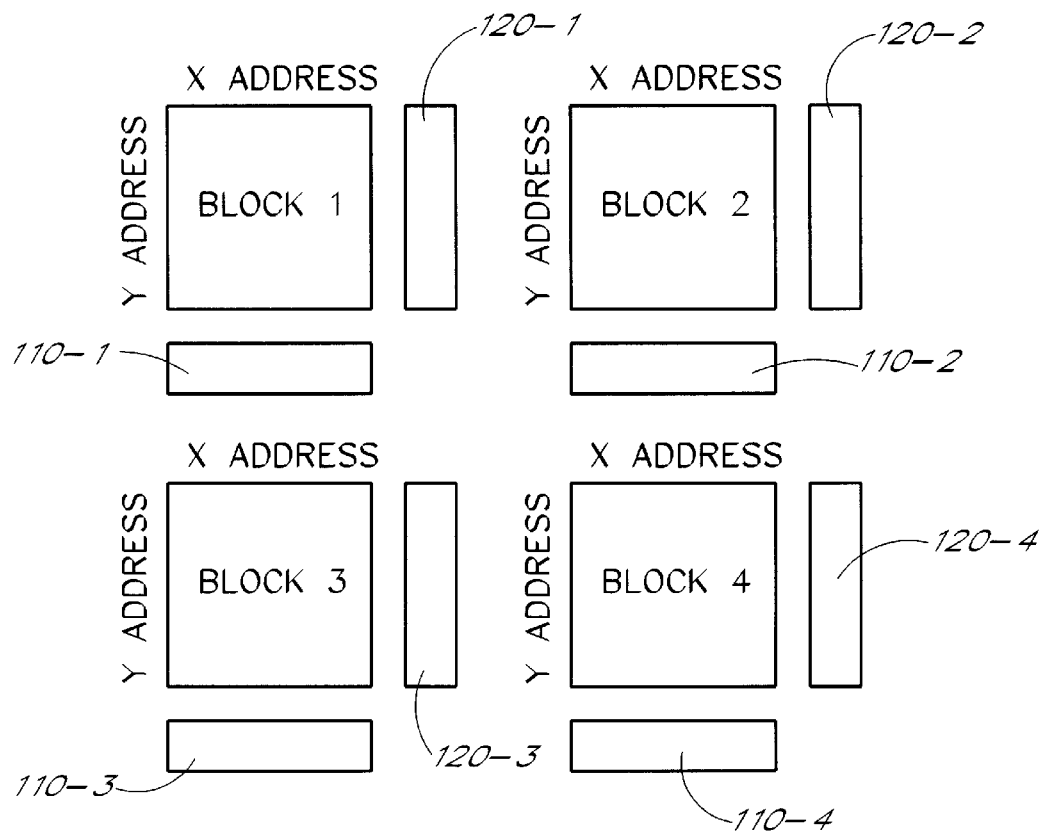
Figure 3:
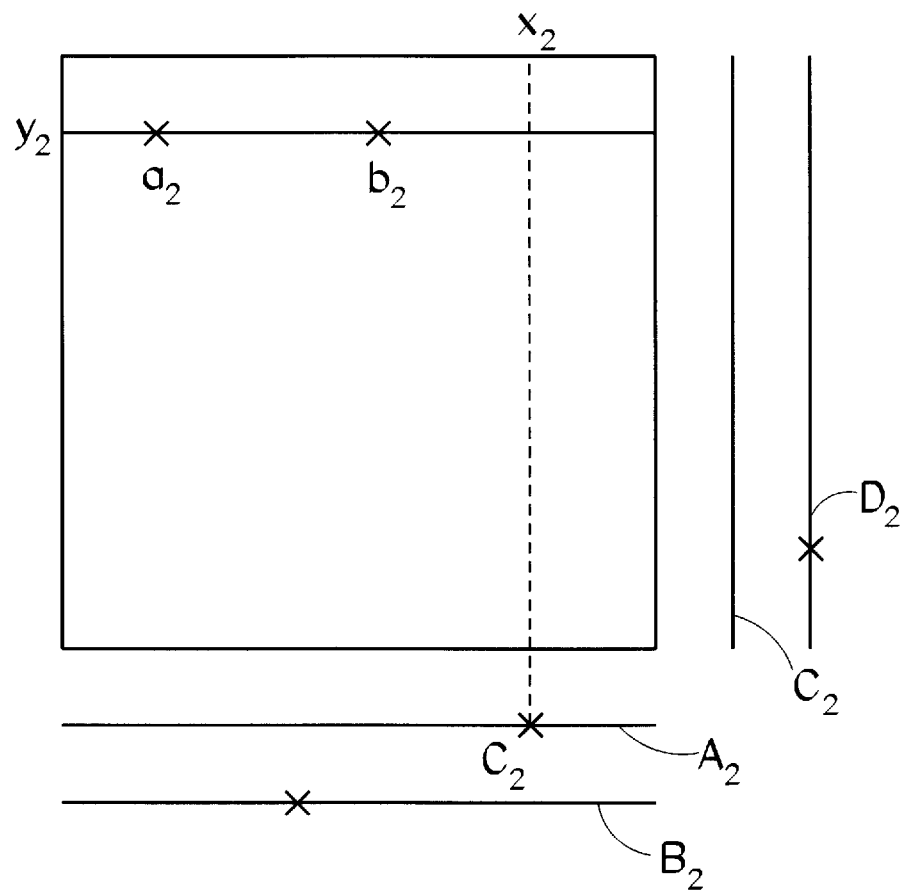
FIG. 3 is a diagrammatic view illustrating repair of a memory device from a fail at a repair address.

In the present embodiment, repair address analysis apparatus 160 (refer to FIG. 1) effects repair address analysis processing in a form including a measurement object memory device and repair lines A1, B1, C1 and D1 included in the measurement object memory device.

In the following, description is given of a case wherein fails a1 and b1 are present at address y1 of measurement object memory device 1 while fail c1 is present at address x1 of repair line A1 and repair line A1 is replaced into address y1 of measurement object memory device 1 to repair measurement object memory device 1 from fails a1 and b1.

Fails a1 and b1 present at address y1 of measurement object memory device 1 are stored as fail count information at address y1 of fail count memory 20, and fail c1 present in address x1 of repair line A1 is stored as fail count information at address x1 of fail count memory 10.

In order to repair measurement object memory device 1 from fail c1 present at address x1 of repair line A1, address x1 of repair line A1 is replaced with repair line C1.

Simultaneously, repair line A1 is replaced with address y1 of measurement object memory device 1. Consequently, measurement object memory device 1 is repaired from fails a1 and b1 present at address y1 thereof.

In this manner, where a fail is present on a repair line, repair address analysis processing can be performed in a short time by processing repair lines A1, B1, C1 and D1 with Xk, Yk regions in which Xn, Yn regions are included while, according to the prior art, fail count information for Xn and Yn regions and fail count information on repair lines A1, B1, C1 and D1 stored in fail count memories 10 and 20, respectively, are processed separately from each other.

It is to be understood that variations and modifications of the repair address analysis system for semiconductor test disclosed herein will be evident to those skilled in the art. It is intended that all such modifications and variations be included within the scope of the appended claim.

What is claimed is:

1. A repair address analysis system for a semi-conductor test comprising a memory device having a redundancy repairing function, a repair line on which information corresponding to a plurality of addresses in said memory device is stored and, when a fail is produced in said memory device, the information corresponding to the address at which the fail is produced in said memory device is replaced, fail count means for counting fail bits for an address value of said memory device, and a fail count memory into which the fail bit count information counted by said fail count means is stored, and wherein said fail count means calculates replacement information of a fail address based on the fail bit count information stored in said fail count memory, said fail count means counts fail bits of the repair line simultaneously with counting of fail bits corresponding to a plurality of addresses in said memory device.

* * * * *